United States Patent
Wang et al.

(10) Patent No.: US 8,468,473 B1
(45) Date of Patent: Jun. 18, 2013

(54) METHOD FOR HIGH VOLUME E-BEAM LITHOGRAPHY

(75) Inventors: Hung-Chun Wang, Taichung (TW); Tzu-Chin Lin, Hsinchu (TW); Chia-Chi Lin, Hsinchu (TW); Nian-Fuh Cheng, Hsinchu (TW); Jeng-Horng Chen, Hsin-Chu (TW); Wen-Chun Huang, Tainan (TW); Ru-Gun Liu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/492,408

(22) Filed: Jun. 8, 2012

(51) Int. Cl.
*G06F 17/50* (2006.01)

(52) U.S. Cl.
USPC .................. 716/55; 716/50; 716/51; 716/62; 716/53; 716/54

(58) Field of Classification Search
USPC .................................... 716/54, 119, 123, 135
See application file for complete search history.

(56) References Cited

U.S. PATENT DOCUMENTS

| | | | | |
|---|---|---|---|---|
| 6,107,207 | A * | 8/2000 | Waas et al. | 438/707 |
| 6,333,138 | B1 * | 12/2001 | Higashikawa et al. | 430/296 |
| 7,266,796 | B1 * | 9/2007 | Chu et al. | 716/123 |
| 2002/0116697 | A1 * | 8/2002 | Okamoto et al. | 716/21 |
| 2011/0239177 | A1 * | 9/2011 | Chong et al. | 716/119 |
| 2011/0265049 | A1 * | 10/2011 | Lapanik et al. | 716/53 |

* cited by examiner

*Primary Examiner* — Vuthe Siek
*Assistant Examiner* — Brian Ngo
(74) *Attorney, Agent, or Firm* — Haynes and Boone, LLP (57) ABSTRACT

The present disclosure describes a method of forming a pattern by an electron beam lithography system. The method includes receiving an integrated circuit (IC) design layout data having a polygon and a forbidden pattern, modifying the polygon and the forbidden pattern using an electron proximity correction (EPC) technique, stripping the modified polygon into subfields, converting the stripped polygon to an electron beam writer format data, and writing the electron beam writer formatted polygon onto a substrate by an electron beam writer. Stripping the modified polygon includes finding the modified forbidden pattern as a reference layer, and stitching the modified polygon to avoid stitching the modified forbidden pattern.

20 Claims, 12 Drawing Sheets

METHOD FOR HIGH VOLUME E-BEAM LITHOGRAPHY

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, light diffraction in an optical lithography system becomes an obstacle for further scaling down the feature size. Common techniques used to decrease the light diffraction impact include an optical proximity correction (OPC), a phase shift mask (PSM), and an immersion optical lithography system. An electron beam lithography system is another alternative to scale down the feature size. However, manufacturing throughput when using an electron beam lithography system is a challenge for fabricating the ICs.

Accordingly, what is needed is a method to improve the throughput by the electron beam lithography system.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
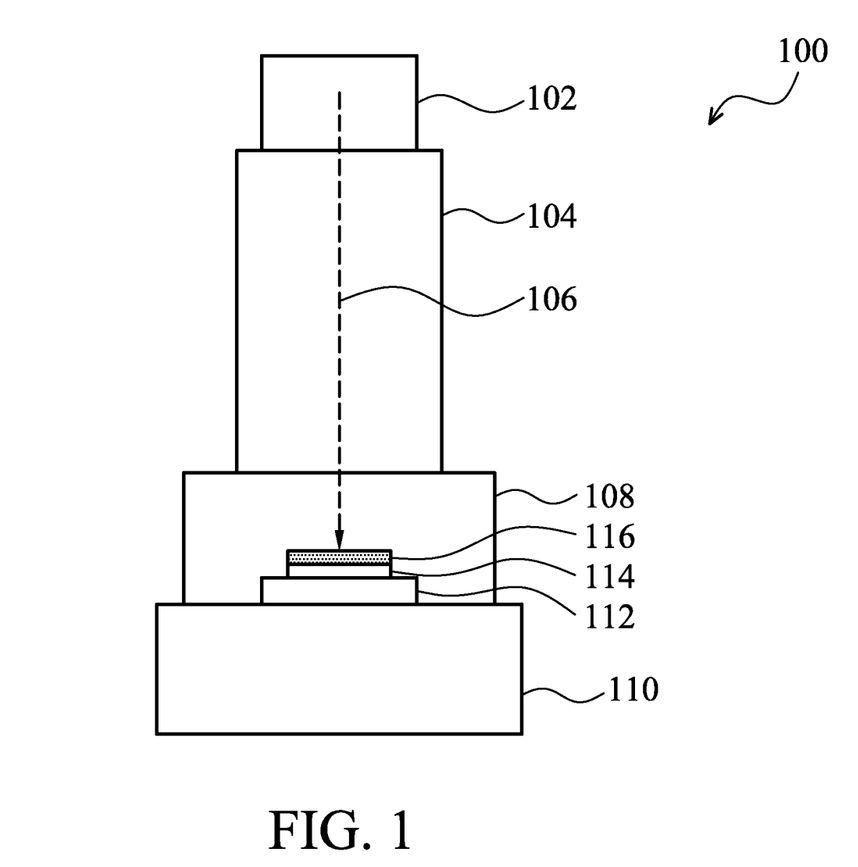
FIG. 1 represents a schematic diagram of an electron beam lithography system for implementing one or more embodiments of the present disclosure.

Referring now to FIG. 1, an electron beam lithography system 100 is an example of a system that can benefit from one or more embodiments of the present disclosure. The electron beam writer system 100 includes an electron source 102, an electron optical column 104, an electron beam 106, a chamber 108, a pump unit 110, a stage 112, a substrate 114, and a resist film 116 formed on the substrate 114. However, other configurations and inclusion or omission of devices may be possible. In the present embodiments, the electron beam lithography system is also referred to as an electron beam writer or an e-beam writer. The electron resource 102 provides a plurality of electrons emitted from a conducting material by heating the conducting material to a very high temperature, where the electrons have sufficient energy to overcome a work function barrier and escape from the conducting material (thermionic sources), or by applying an electric field sufficiently strong that the electrons tunnel through the work function barrier (field emission sources). The electron optical column 104 includes a plurality of electromagnetic apertures, electrostatic lenses, electromagnetic lenses, shaping deflectors and cell selection deflectors; and provides the electron beam 106 for the system, such as a plurality of Gaussian spot electron beams, a plurality of variable shaped electron beams and a plurality of cell projection electron beams. The chamber 108 includes a wafer loading and unloading unit, and provides the wafer transportation without interrupting an operation of the electron beam lithography system 100 when loading the wafer into the system and unloading the wafer out of the system. The pump unit 110 includes a plurality of pumps and filters, and provides a high vacuum environment for the electron beam lithography system 100. The stage 112 includes a plurality of motors, roller guides, and tables; secures the substrate 114 on the stage 112 by vacuum; and provides the accurate position and movement of the substrate 114 in X, Y and Z directions during focus, leveling and exposure operation of the substrate 114 in the electron lithography system 100.

Continuing with the present embodiments, the substrate 114 deposited with the resist film 116 is loaded on the stage 112 for the electron beam 106 exposure. In the present disclosure, the resist is also referred to as a photo resist, an electron beam resist, a resist film and a photo resist film. The substrate 114 includes a wafer substrate or a blank mask substrate. The wafer substrate includes a silicon wafer. Alternatively or additionally, the wafer may includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). A plurality of conductive and non-conductive thin films may be deposited on the wafer. For example, the conductive thin films may include a metal such as aluminum (Al), Copper (Cu), tungsten (W), nickel (Ni), titanium (Ti), gold (Au), and platinum (Pt) and, thereof an alloy of the metals. The insulator film may include silicon oxide and silicon nitride. The blank mask substrate may include a low thermal expansion material such as quarts, silicon, silicon carbide, and silicon oxide-titanium oxide compound.

Figure 2:
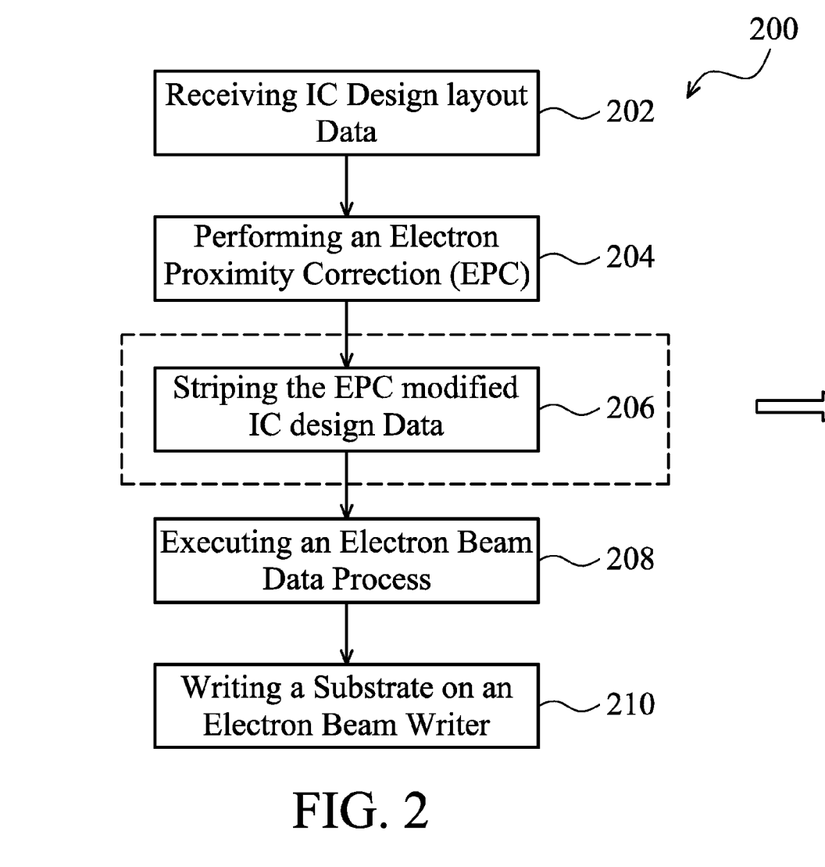
FIG. 2 is a flow chart of an integrated circuit (IC) design data flow in an electron beam writer system according to one or more embodiments of the present disclosure.

Referring now to FIG. 2, a method 200 includes using the electron beam lithography system 100 to expose the resist film deposited on the substrate according to one or more embodiments of the present disclosure. First, the method 200 begins at step 202 by receiving integrated circuit (IC) design layout data from a designer. The designer can be a separate design house or can be part of a semiconductor fabrication facility (fab) for making IC productions according to the IC design layout data. In the present disclosure, IC design layout data is also referred to as IC design layout pattern, or an IC design layout. The IC design layout includes various IC features (also refereed to as main features), such as active region, isolation region, gate electrode, source and drain, metal lines or via of the interlayer interconnection and opening for bonding pads, to be formed in the substrate. The IC design layout pattern includes a plurality of pattern layers. A typical IC design layout data is presented in a GDS file format. In the present disclosure, a feature is also referred to as a polygon. The method 200 proceeds to step 204 for performing an electron proximity correction (EPC) process. The proximity effect in the electron beam lithography system 100 is that a uniform exposure by the incident beam can give rise to a non-uniform distribution of actually received exposure in a pattern area. The non-uniform distribution of the electron beam is caused by an electron scattering from the substrate. The EPC is a compensation process for critical dimension (CD) due to the electron scattering from the substrate. The EPC process may include size bias correction, shape correction, dose correction, and background dose equalization (GHOST) correction. After performing the EPC at step 204, the method 200 proceeds to step 206 for a stripping process. In the stripping process at step 206, the EPC modified design layout data is divided into a plurality of strips, or subfields. The subfield may further divide into a plurality of sub-subfields. In the present disclosure, the subfields may be also referred to as the subsubfields for simplicity. The step 206 also includes assigning an electron beam to each strip, or sub-field. After the stripping process at step 206, the method 200 proceeds to step 208 for executing an electron beam data process. The step 208 includes checking the stripped IC design layout data for error, and then converting the stripped IC design layout data to an electron beam writer format data. The step 208 also includes minimizing a difference among the electron beams assigned to the strips or subfields, such as a beam dose correction, a beam shift correction, a beam scale correction, and a beam rotation correction. After step 208, the method 200 processes to step 210 for writing the IC design layout pattern to the substrate by the electron beam lithography system 100. In the present disclosure, writing the pattern to the substrate is also referred to as exposing the substrate or scanning the substrate with the patterned electron beam. Addition steps can be provided before, during, and after the method 200, and some of the steps described can be replaced, eliminated or moved around for addition embodiments of the method 200.

In the electron beam lithography system 100 as shown in FIG. 1, the electron beam 106 can deflect, for example, approximate 2 um. In order to write a field or a substrate, multiple electron beams are used and the stage 112 of the electron beam lithography system 100 is moved during writing the patterns on the substrate. In the present embodiments, the stage 112 moves in y direction and the electron beam 106 deflects in x direction simultaneously. Each electron beam 106 cover one strip or one subfield. In one embodiment, for example, 13,000 electron beams are applied to write the IC circuit with a field size 26×33 mm.

Figure 3:
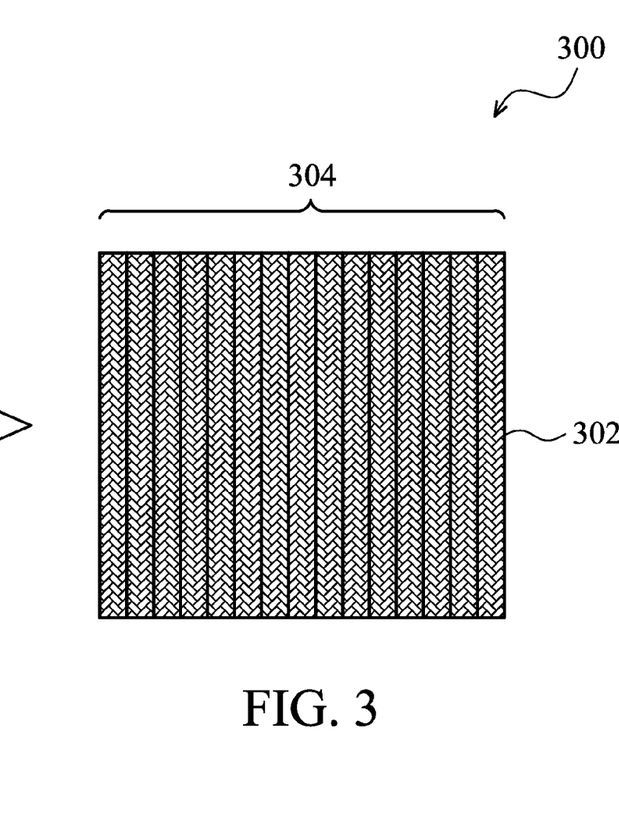
FIG. 3 is a schematic diagram of striping a field of a device according to one or more embodiments of the present disclosure.

Referring now to FIG. 3, an example of stripping a device 300 is illustrated according to one or more embodiments of the present disclosure. The device 300 includes a field 302 and a plurality of strips 304. However, other configurations of the device may be possible. In the present embodiments, the field 302 includes a layout of a mask, or a field of the IC circuit on the wafer substrate. As shown in FIG. 3, the field 302 is divided into the plurality of strips 304, or subfields. Each strip 304 is assigned with one patterned electron beam. Therefore, the field 302 is scanned by the plurality of patterned electron beams. The IC design layout pattern is directly written on the resist film deposited on the substrate by scanning the substrate strip by strip with the plurality of patterned electron beams in the electron beam lithography system 100. The scanning continues until the entire substrate is patterned. Because some patterns extend across the strip boundary or the subfield boundary, a butting error may occur at the subfield boundary.

Figure 4:
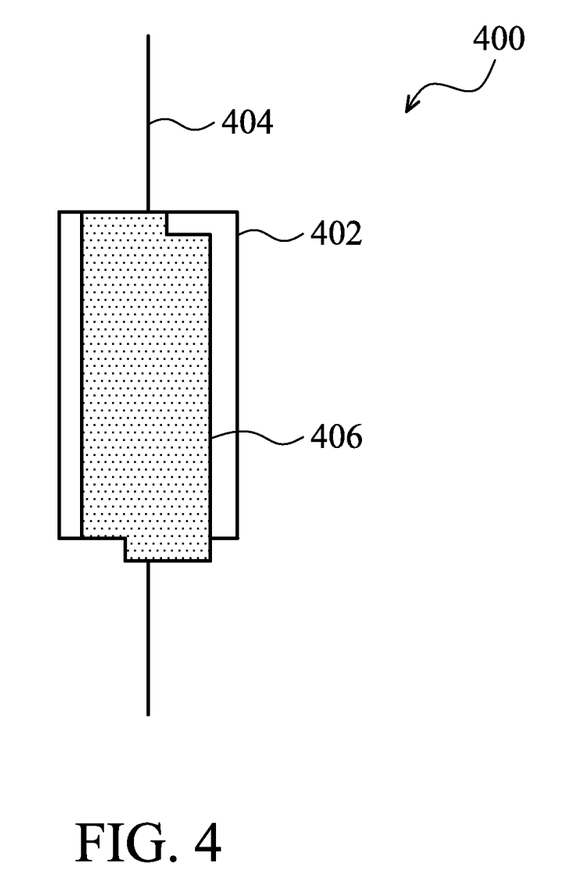
FIG. 4 is an example of a butting error at a boundary of two subfields in an electron beam writer system for implementing one or more embodiments of the present disclosure.

Referring now to FIG. 4, an example of a resist pattern error 400 at one strip boundary or at one subfield boundary is presented according to one or more embodiments of the present disclosure. A pattern 402 is an intended pattern. The pattern 402 crosses two strips. A strip boundary line 404 is divided the two strips. The pattern 402 is formed by two electron beams scanning in two adjacent subfields. A pattern 406 is the actual final pattern produced by two electron beams scans. As shown in the FIG. 4, it is noted that the pattern 406 may include CD and overlay issues.

Figure 5:
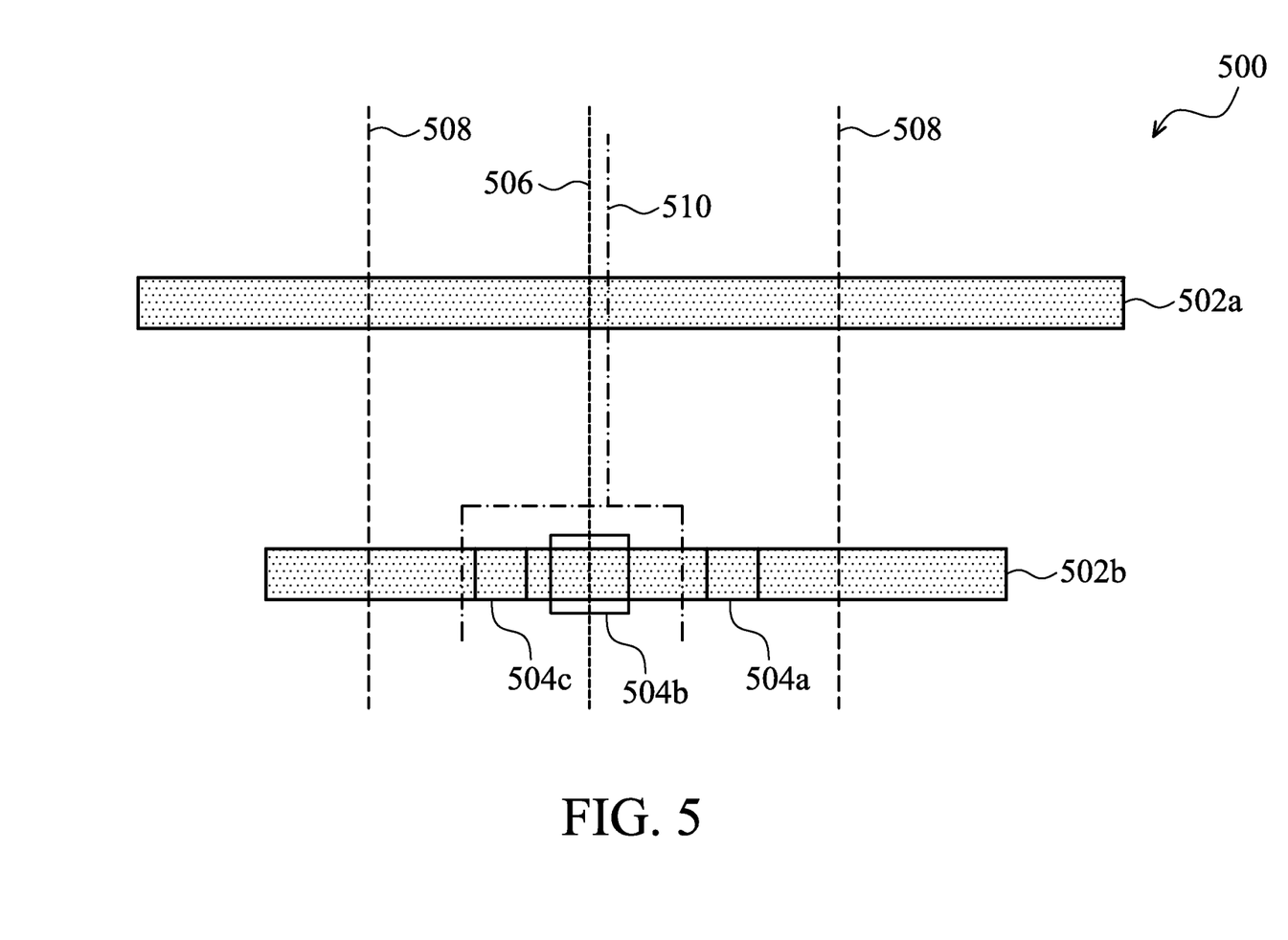
FIG. 5 is an example of stitching a device for implementing one or more embodiments of the present disclosure.

Referring now to FIG. 5, an example of stitching a device 500 is illustrated according to one more embodiments of the present disclosure. The device 500 includes polygons 502a-b, and forbidden patterns 504a-c. However, other configurations and inclusion or omission of the device may be possible. In the present disclosure, stitching a device is also refereed to as striping a device. In the present embodiments, the polygons 502a-b may include a metal line, and the forbidden patterns 504a-c may include a via, or a contact connecting the interlayer metal lines. In one embodiment, the forbidden patterns 504a-c may form before the polygons 502a-b are formed, or after the polygons 502a-c are formed. In another embodiment, the forbidden patterns 504a-c may form at the same layer as the polygons 502a-b are formed. As showed in FIG.

5, the polygon 502a and 502b cross a stripe boundary line 506. Stripe buffer boundary lines 508 are located at both sides of the stripe boundary line 506 respectively. A distance between the stripe boundary line 506 and the strip buffer boundary line 508 is about 10% of the width of the stripe, for example, approximate 0.2 um. Therefore a width of a strip buffer zone is about 0.4 um. As shown in FIG. 5, if stitching the device 500 along the stripe boundary line 506, the forbidden pattern 504b is divided into two different strips. The divided forbidden pattern 504b may cause CD or overlay issues as showed in FIG. 4. Therefore, a stitching line 510 moves away from the forbidden pattern 504c to avoid stitching the forbidden pattern 504c. In one example, the stitching line 510 is away from the stripe boundary line from 0 to 200 nm). In the present disclosure, the width of the strip and the associated buffer zone width are not fixed and varies the IC design layout data and the process optimization. In this example, the width of the strip is about 2 um and the buffer zone width is about 10% of the width of the stripe.

Figure 6:
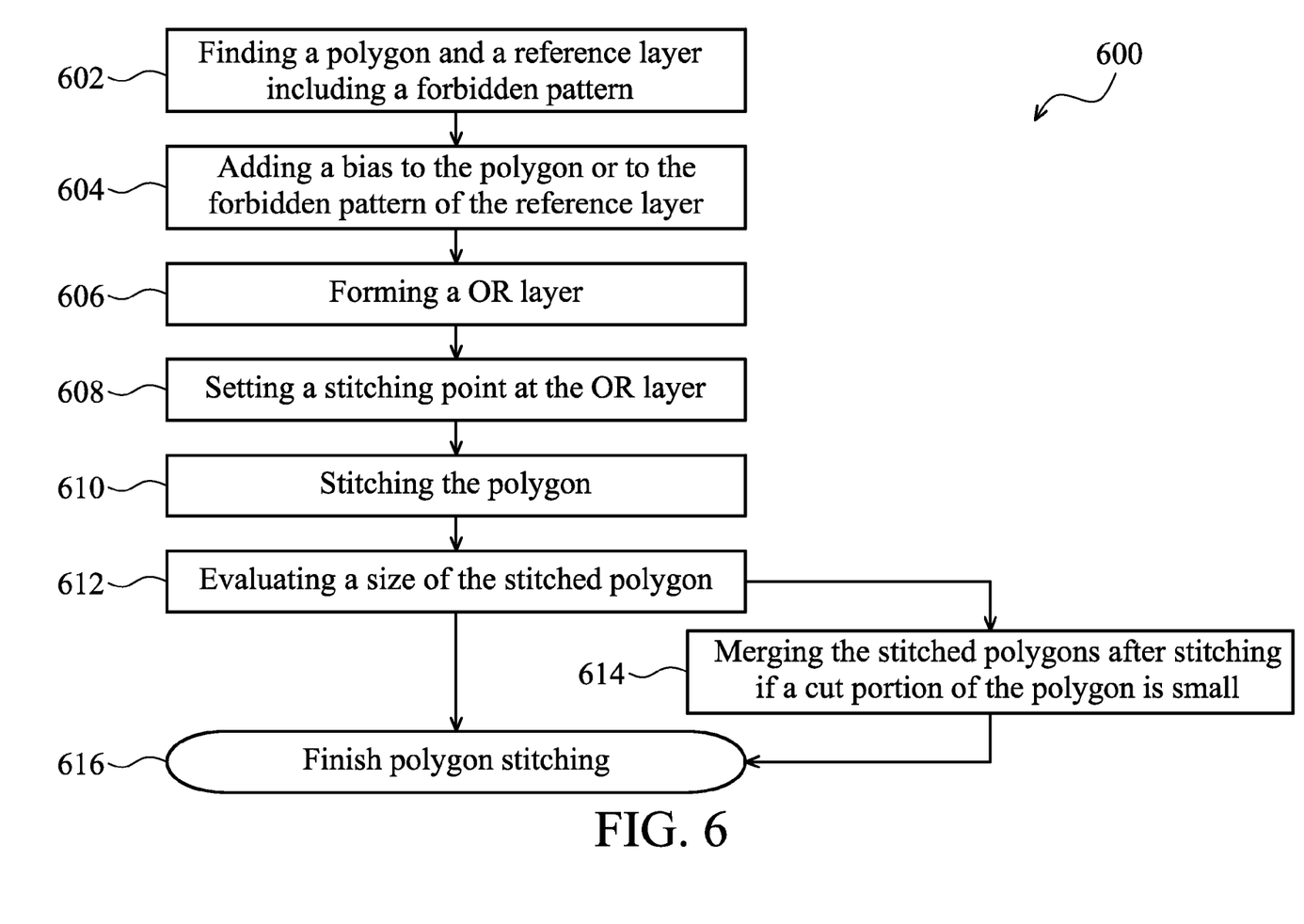
FIG. 6 is a flow chart of stitching a polygon of a device for implementing one or more embodiments of the present disclosure.
Figure 7:
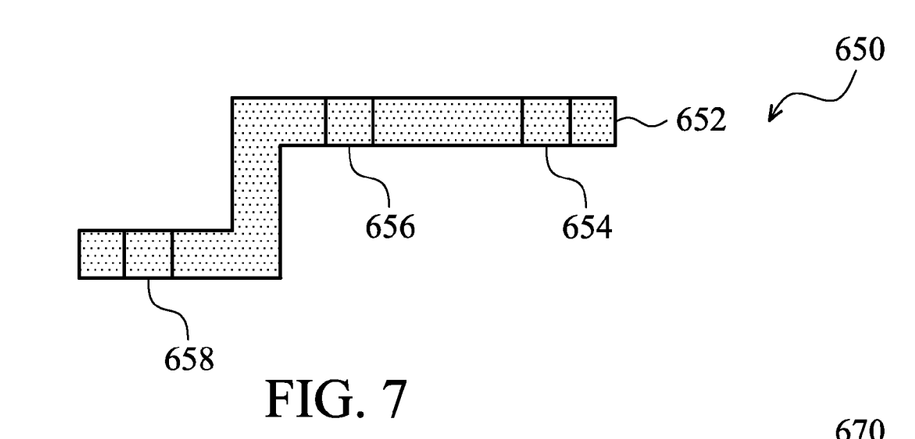
FIGS. 7-8 represent an example of stitching a polygon of a device for implementing one or more embodiments of the present disclosure.
Figure 8:
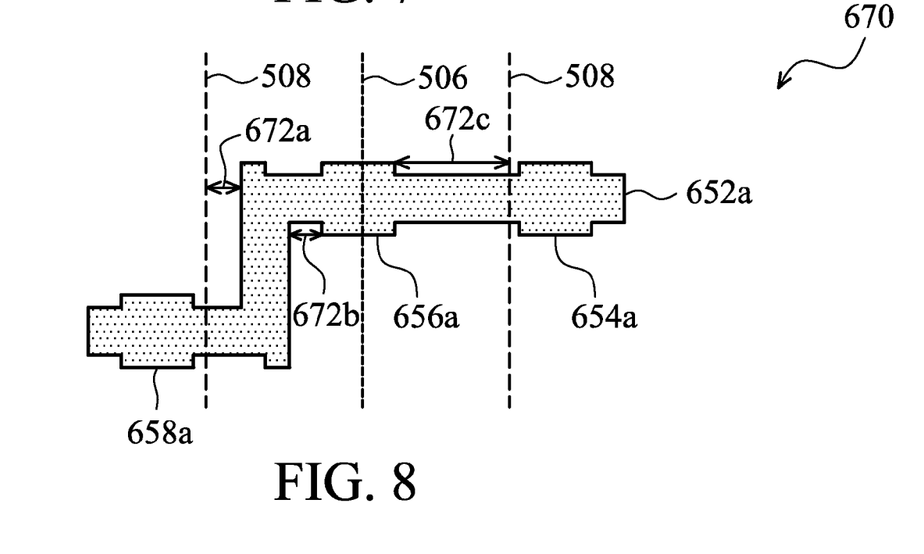

Referring now to FIG. 6, a method 600 of stitching a polygon of a device 650 is illustrated according to one or more embodiments of the present disclosure. The device 650 shown in FIG. 7 includes a polygon 652 and the forbidden patterns 654, 656, and 658 of a reference layer. However, other configurations of the device may be possible. The method 600 begins at step 602 by finding the polygon 652 and the forbidden pattern 654, 656, and 658 of the reference layer of the device 650 as shown in FIG. 7. The method 600 proceeds to step 604 by adding or subtracting a bias to the polygon 652, or to the forbidden patterns 654, 656, and 658. In the present embodiments, the bias may range from approximate 0 to 1000 nm. The bias may be in x (horizontal) direction, or in y (vertical) directions, or in both x and y direction. The step 604 may be performed at the EPC process as shown in step 204 of the method 200. The method 600 proceeds to step 606 to form an OR layer 670 as shown in FIG. 8, by adding the biased polygon 652a and the biased forbidden patterns 654a, 656a, and 658a. The method 600 proceeds to step 608 for setting a stitching point on the OR layer 670. In the present embodiments, the stitching point can be set at the stitching point 672a, the stitching points 672b, or the stitching point 672c, as shown in FIG. 8, as long as the stitching points 672a-c are not set on the biased forbidden pattern 654a, 656a, or 658a. In one embodiment, the stitching points 672a-c may be set away from the strip boundary line ranging from 0 to about 200 nm. The method 600 proceeds to step 610 for stitching the bias polygon 652a at the stitching point 672a, at the stitching point 672b, or at the stitching point 672c.

Figure 9:
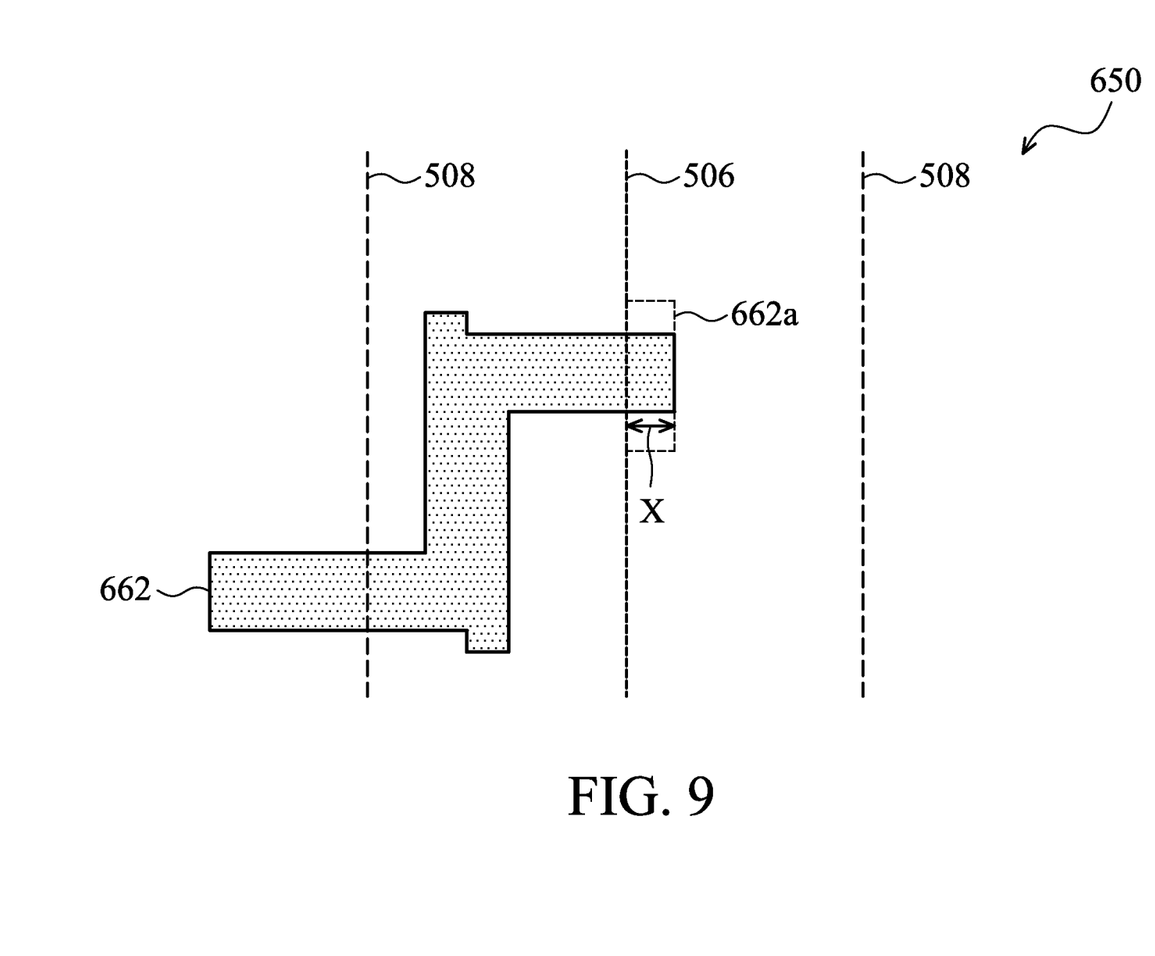
FIG. 9 is an example of merging a polygon of a device for implementing one or more embodiments of the present disclosure.

As shown in FIG. 9, a biased polygon 662 of the device 650 does not superimpose with any forbidden pattern. However, one end of the polygon 662 is close to the stripe boundary line 506. For example, the polygon 662 is stitched at the strip boundary line 506 and a small stitched polygon 662a is generated. The butting error as shown in FIG. 4 may arise because of the small stitched polygon 662a. Therefore the method 600 proceeds to step 612 for evaluating the dimension of the stitched polygon 662a. If a dimension X of the stitched polygon 662a is smaller than or equal to 200 nm, the method 600 proceeds step 614 for merging the stitched polygon 662a to form the original polygon 662. If the dimension X of the stitched polygon 662a is greater than 200 nm, the method 600 proceeds to step 616 to finish stitching the polygon 662. Additional steps can be provided before, during, and after the method 600, and some the steps described can be replaced, eliminated, or moved around for additional embodiments of the method 600.

Figure 10:
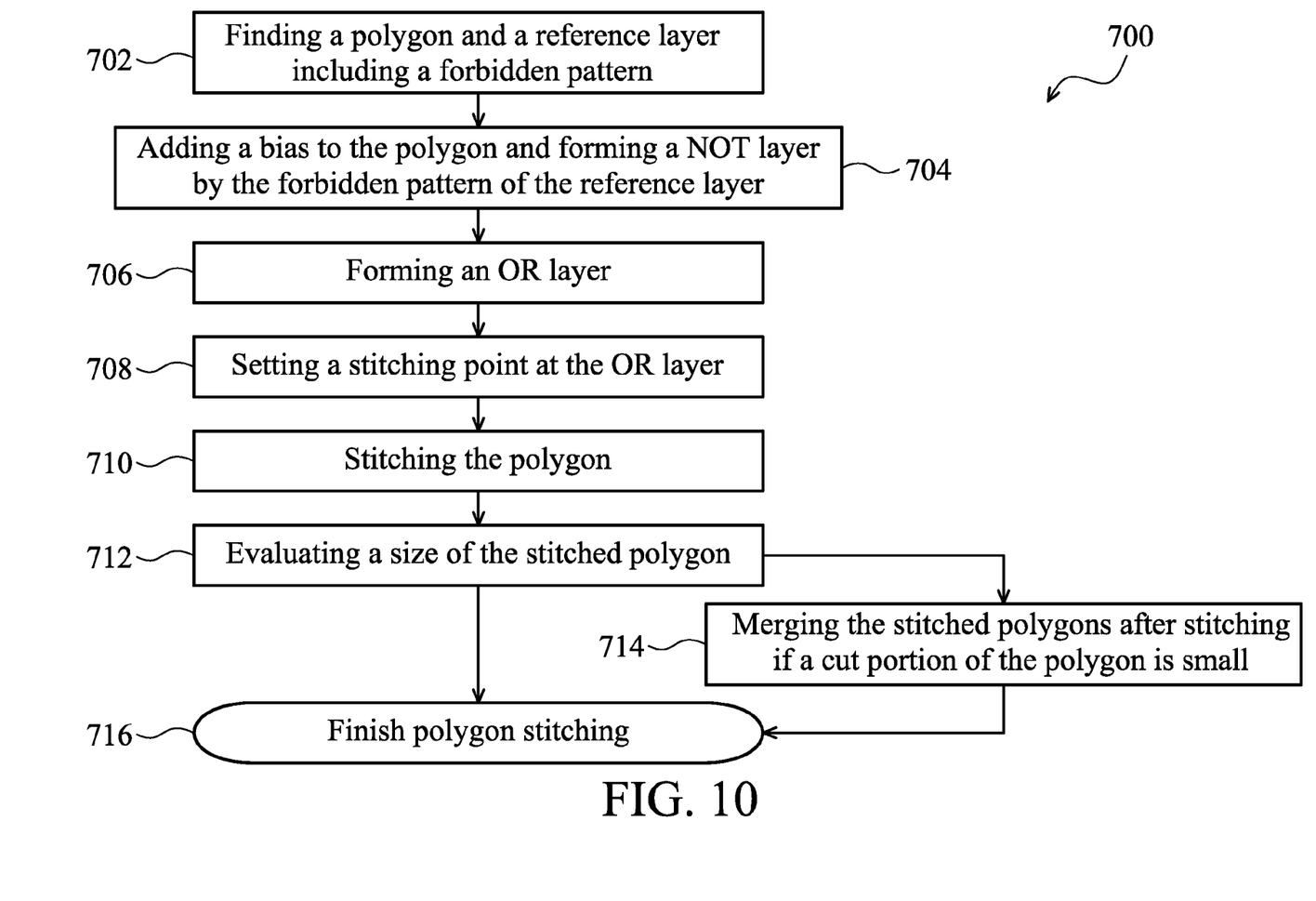
FIG. 10 is a flow chart of stitching a polygon of a device for implementing one or more embodiments of the present disclosure.
Figure 11:
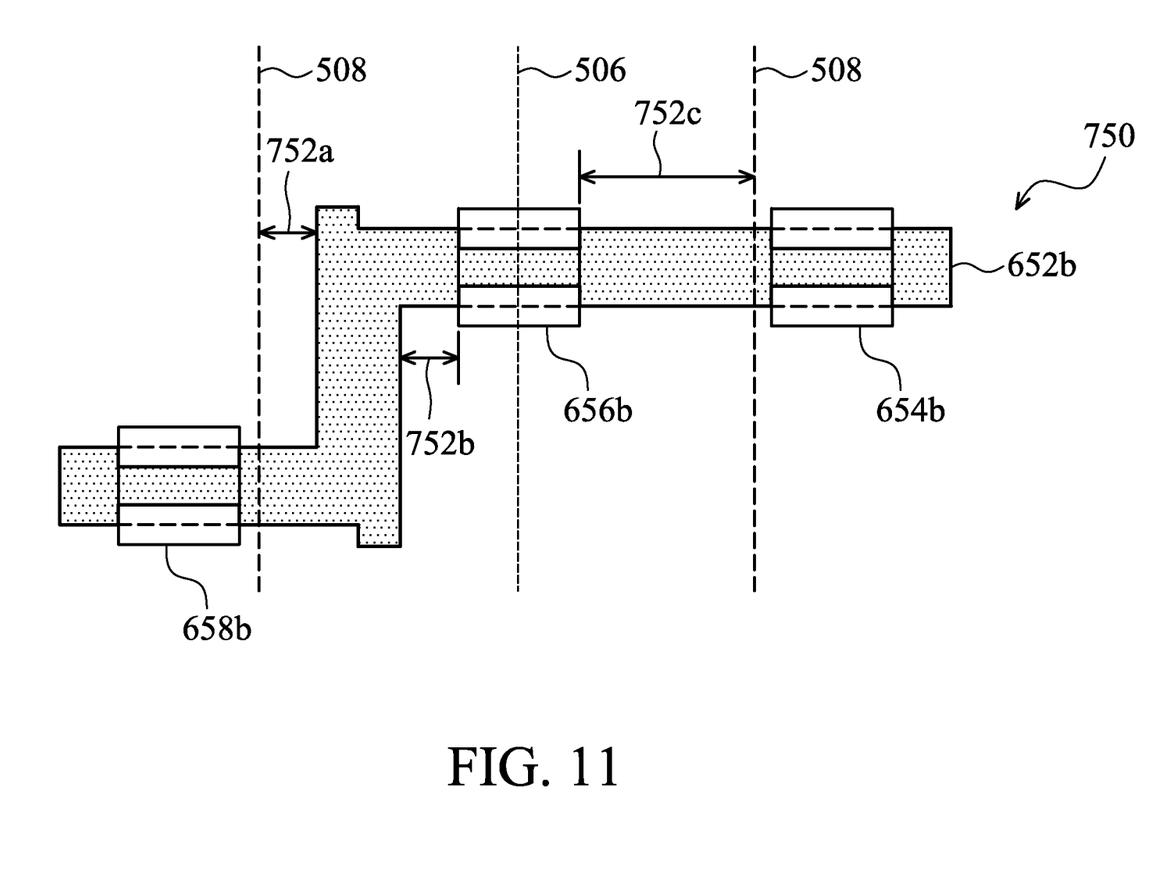
FIG. 11 represents an example of stitching a polygon of a device for implementing one or more embodiments of the present disclosure.

Referring now to FIG. 10, a method 700 of stitching a polygon of the device 650 is illustrated according to one or more embodiments of the present disclosure. The method 700 begins at step 702 by finding the polygon 652 and the forbidden pattern 654, 656, and 658 of the reference layer as shown in FIG. 7. The method 700 proceeds to step 704 by adding or subtracting a bias to the polygon 652 of the device 650 to form a biased polygon 652b. The step 704 also includes forming NOT patterns 654b, 656b, and 658b by subtracting the bias from the forbidden patterns 654, 656, and 658 of the reference layer of the device 650. In the present embodiments, the bias may range from approximate 0 to 1000 nm. The bias may be in x (horizontal) direction, or in y (vertical) direction, or in both x and y directions. The method 700 proceeds to step 706 to form an OR layer 750 by the bias polygon 652 and the NOT pattern 654b, 656b, and 658b as shown in FIG. 11. The OR layer 750 includes the bias polygon 652b, and the NOT pattern 654b, 656b, and 658b. The method 700 proceeds to step 708 for setting stitching points 752a-c on the OR layer 750. In the present embodiments, the stitching point can be set at the stitching point 752a, the stitching points 752b, or the stitching point 752c, as shown in FIG. 11, as long as the stitching points 752a-c are not set on the NOT pattern 654b, 656b, or 658b. In one embodiment, the stitching points 752a-c may be set away from the strip boundary line ranging from 0 to about 200 nm. The method 700 proceeds to step 710 for stitching the bias polygon 652b. After the step 710, the method 700 proceeds to step 712 for evaluating the dimension of the stitched polygon 662a as shown in FIG. 9. If a dimension X of the stitched polygon 662a is smaller than or equal to 200 nm, the method 700 proceeds step 714 for merging the stitched polygon 662a to form the original polygon 662. If the dimension X of the stitched polygon 662a is greater than 200 nm, the method 600 proceeds to step 716 to finish stitching the polygon 662. Additional steps can be provided before, during, and after the method 700, and some the steps described can be replaced, eliminated, or moved around for additional embodiments of the method 700.

Figure 12:
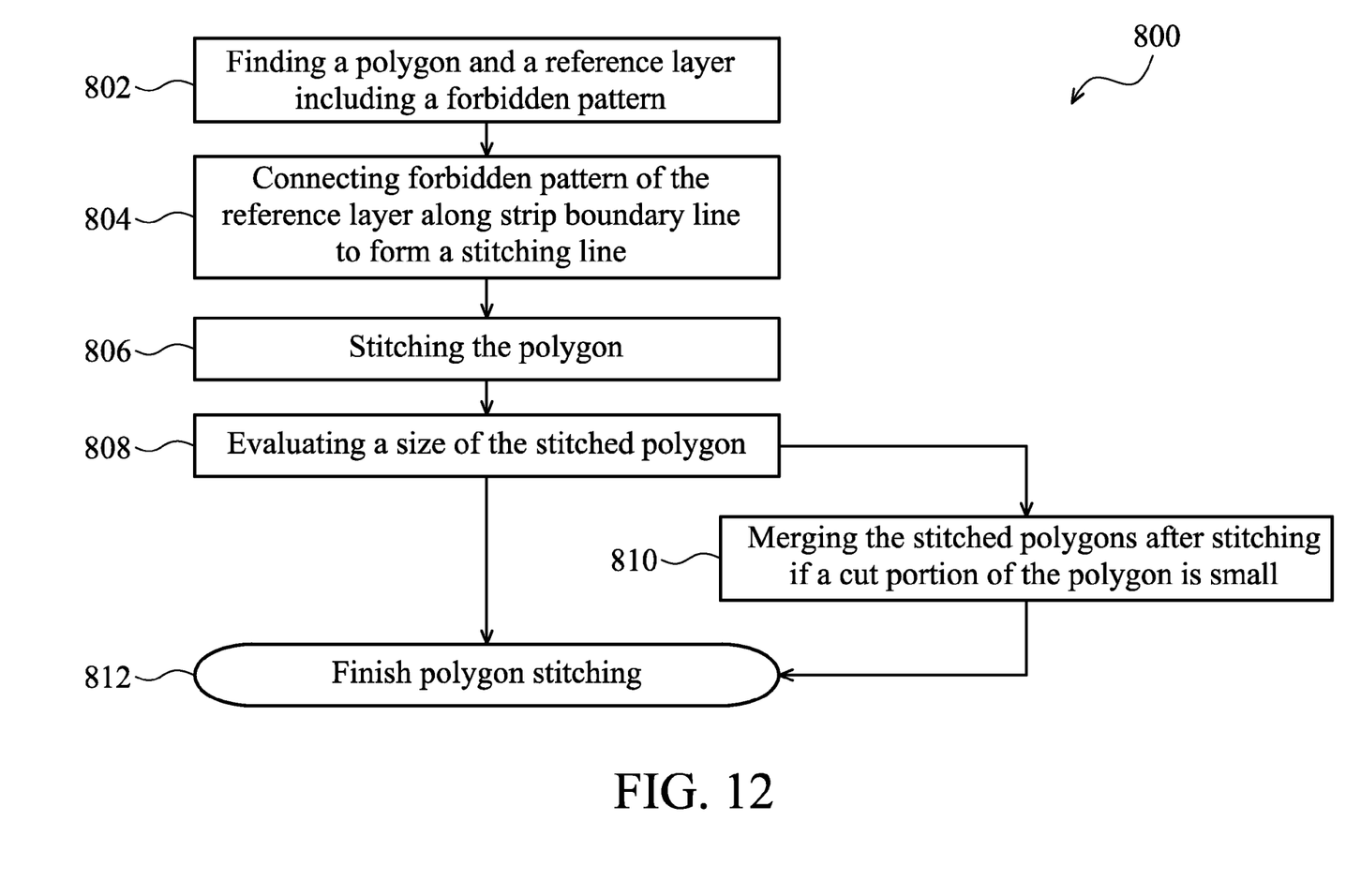
FIG. 12 is a flow chart of stitching a polygon of a device for implementing one or more embodiments of the present disclosure.
Figure 13:
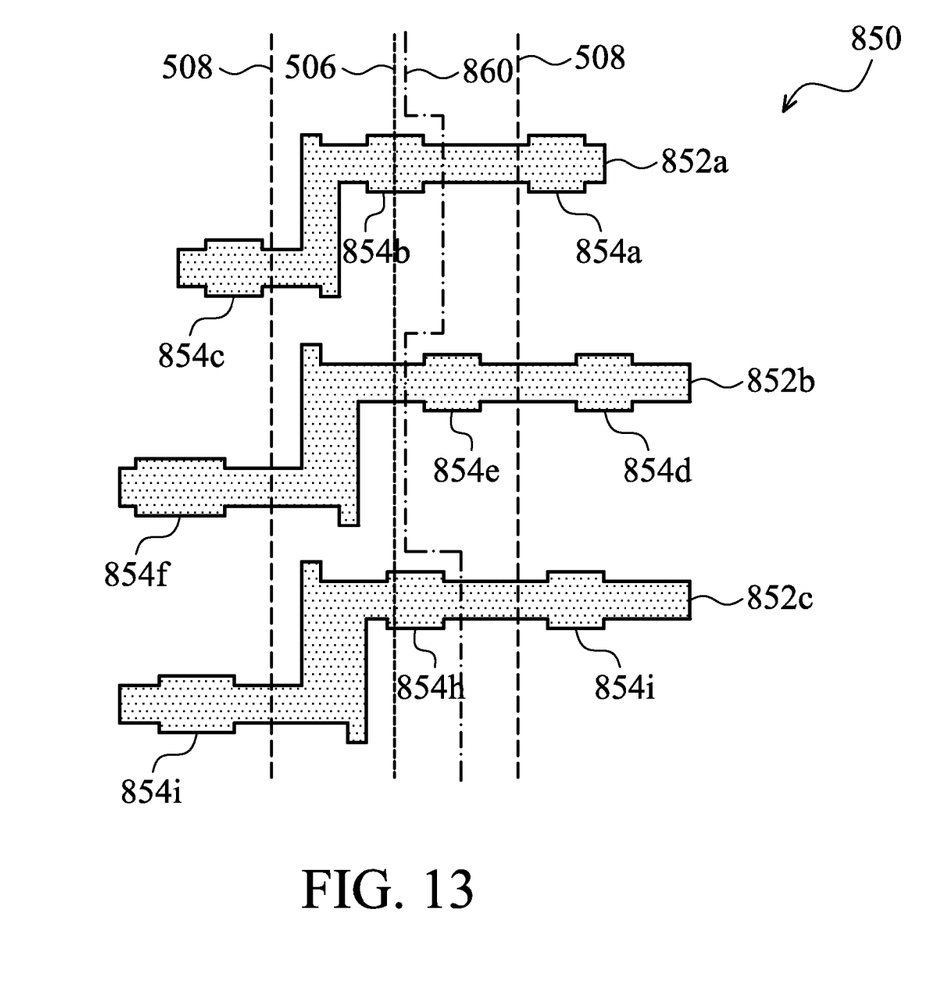
FIG. 13 represents an example of stitching a polygon of a device for implementing one or more embodiments of the present disclosure.

Referring now to FIG. 12, a method 800 of stitching a polygon of a device 850 is illustrated according to one or more embodiments of the present disclosure. The device 850 as shown in FIG. 13 includes polygons 852a-c, and forbidden patterns 854a-i from a reference layer. However, other configurations of the device may be possible. The method 800 begins at step 802 by finding the polygons 852a-c and the forbidden patterns 854a-i of the reference layer as shown in FIG. 13. The method 800 proceeds to step 804 by forming a stitching line 860 to stitch the polygons 852a, 852b, and 852c. The step 804 includes forming the stitching line 860 along the strip boundary line 506. If the strip boundary line 506 does not cross the forbidden pattern, the stitching line 860 superimposes over the strip boundary line 506. However, if the strip boundary line 506 crosses the forbidden pattern, the stitching line 860 moves away from the strip boundary line 506 to avoid stitching the forbidden pattern. For example, the strip boundary line 506 crosses the forbidden pattern 854b, the stitch line 860 moves away from the strip boundary line 506, for example, by 0 to approximate 200 nm, to avoid stitching the forbidden pattern 854a as shown in FIG. 12. In one example, the strip boundary line 506 does not cross the forbidden pattern, the stitching line 860 superimposes over the strip boundary line 506 when stitching the polygon 852b as shown in FIG. 12. In another example, the strip boundary line 506 crosses the forbidden pattern 854i, the stitch line 860 moves away from the strip boundary line 506 to avoid stitching the forbidden pattern 854i as shown in FIG. 12.

As shown in FIG. 12, after step 804, the method 800 proceeds to step 806 to stitch the polygons 852a-c by the stitching line 860 as shown in FIG. 13. The method 800 proceeds to step 808 for evaluating the dimension of the stitched polygon as shown in FIG. 9. If a dimension X of the stitched polygon 662a is smaller than or equal to about 200 nm, the method 800 proceeds step 810 for merging the stitched polygon 662a to form the original polygon 662. If the dimension X of the stitched polygon 662a is greater than about 200 nm(, the method 800 proceeds to step 812 to finish stitching the polygon 662. Additional steps can be provided before, during, and after the method 800, and some the steps described can be replaced, eliminated, or moved around for additional embodiments of the method 800.

Figure 14:
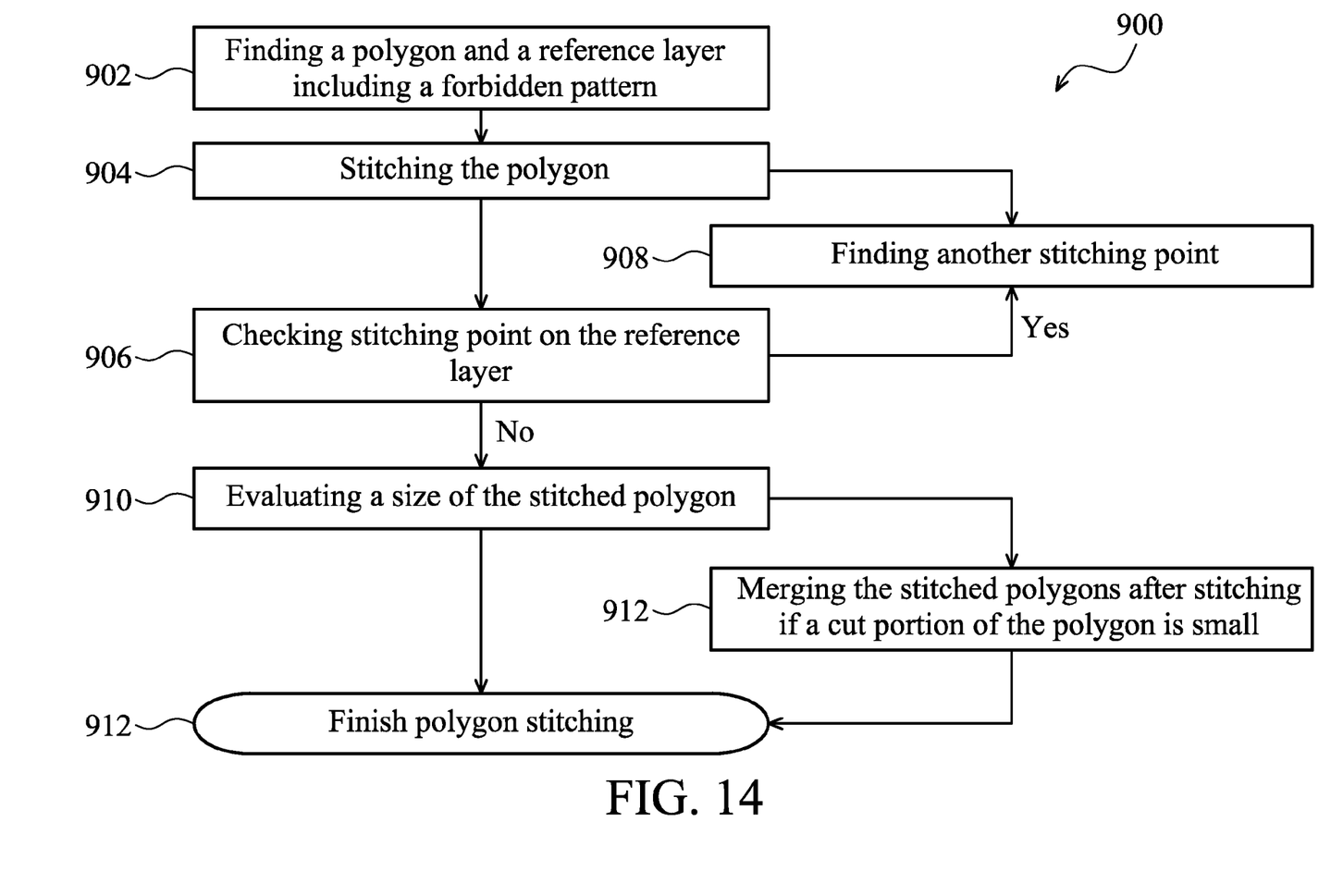
FIG. 14 is a flow chart of stitching a polygon of a device for implementing one or more embodiments of the present disclosure.

Referring now to FIG. 14, a method 900 of stitching a polygon of the device 850 is illustrated according to one or more embodiments of the present disclosure. The method 900 begins at step 902 by finding the polygons 852a-c and the forbidden patterns 854a-i of the reference layer as shown in FIG. 13. The step 902 also includes adjusted the polygons 852a-c and the forbidden patterns 854a-i of the reference layer by adding a bias. The bias may add to in x direction, or y direction, or both directions. The bias ranges from 0 to approximate 1000 nm. The method 900 proceeds to step 904 for stitching the polygon along the strip boundary line 506 as shown in FIG. 13. At the same time, the method 900 proceeds to step 906 for checking if a stitching point lands on the forbidden patterns of the reference layer. If the stitching point lands on the forbidden patterns of the reference layer, the method 900 proceeds to step 908 to find another stitching point by moving away from the strip boundary line 506, and then proceeds to step 904 for stitching the polygon. The stitching point may move away from the strip boundary line 506, ranging from approximate 0-200 nm. If the stitching point does not land on the forbidden patterns of the reference layer, the method 900 proceeds to step 910 for evaluating the stitched polygon as shown in FIG. 9. If a dimension X of the stitched polygon 662a is smaller than or equal to about 200 nm, the method 900 proceeds to step 912 for merging the stitched polygon 662a to form the original polygon 662. If the dimension X of the stitched polygon 662a is greater than 200 nm (this value varies with buffer zone width), the method 900 proceeds to step 914 to finish stitching the polygon 662. Additional steps can be provided before, during, and after the method 900, and some the steps described can be replaced, eliminated, or moved around for additional embodiments of the method 900.

The foregoing outlines features of several embodiments for striping a field of the IC circuit for exposing a resist film deposited on a substrate. Different embodiments may have different advantages, and no particular advantage is necessarily required of any embodiment.

Thus, the present disclosure describes a method of forming a pattern by an electron beam lithography system. The method includes receiving an integrated circuit (IC) design layout data having a polygon and a forbidden pattern, modifying the polygon and the forbidden pattern using an electron proximity correction (EPC) technique, stripping the modified polygon into subfields, converting the stripped polygon to an electron beam writer format data, and writing the electron beam writer formatted polygon onto a substrate by an electron beam writer. The stripping the modified polygon includes finding the modified forbidden pattern as a reference layer, and stitching the modified polygon by avoiding stitching the modified forbidden pattern. The modifying the polygon and the forbidden pattern by the EPC includes adding or subtracting a bias to or from the polygon or the forbidden pattern at horizontal direction, or vertical direction, or both. The bias includes ranging approximately from 0 to 1000 nm. The striping the modified polygon includes forming an OR layer from the modified polygon and the modified forbidden pattern, and stitching the modified polygon by avoiding stitching the forbidden pattern of the OR layer. The striping the modified polygon includes forming a NOT layer from the modified polygon and the modified forbidden patterns, and stitching the modified polygon by avoid stitching the forbidden pattern of the NOT layer. The striping the modified polygon includes setting a stitching line along a strip boundary line by inspecting the forbidden pattern, and moving the stitching line away from the strip boundary line if the strip boundary line crosses the modified forbidden pattern. The striping the modified polygon includes stitching the modified polygon along the strip pitch boundary line, and moving away from the strip boundary line if a stitching point landing on the modified forbidden pattern. The avoiding stitching the forbidden pattern includes setting the stitching line away from the forbidden pattern about from 0 to 200 nm. The method further includes merging the stitched polygon to the original modified polygon if the stitched polygon is smaller than 200 nm.

The present disclosure also describes a method of forming a pattern by an electron beam lithography system. The method includes receiving an integrated circuit (IC) design layout data having a polygon and a forbidden pattern, modifying the polygon and the forbidden pattern using an electron proximity correction (EPC) technique, stripping the modified polygon into subfields, converting the stripped polygon to an electron beam writer format data, and writing the electron beam writer formatted polygon onto a substrate by an electron beam writer. The stripping the modified polygon includes finding the forbidden pattern as a reference layer, forming an OR layer or a NOT layer with the reference layer, and stitching the modified polygon by avoiding stitching the forbidden pattern of the OR layer or the NOT layer. The avoiding stitching the forbidden pattern of the reference layer includes moving the stitching line away from the forbidden pattern approximately from 0 to 200 nm. The method also includes merging the stitched polygon to form the original modified polygon if the stitched polygon is smaller than 200 nm.

In another embodiment, a method of forming a pattern by an electron beam lithography system is presented. The method includes receiving an integrated circuit (IC) design layout data comprising pattern layers having a polygon and a forbidden pattern, modifying the polygon and the forbidden pattern using an electron proximity correction (EPC) technique, stripping the modified polygon into subfields, converting the stripped polygon to an electron beam writer format data, and writing the electron beam writer formatted polygon onto a substrate by an electron beam writer. The striping the modified polygon includes finding the forbidden pattern as a reference layer, and stitching the modified polygon by avoiding stitching the forbidden pattern of the reference layer by moving a stitching line away from a strip boundary line. The further includes setting the stitching line by inspecting the forbidden pattern along the strip pitch boundary line. The stitching line superimposes over the strip boundary line if the strip boundary line not hitting the forbidden pattern, or moving the stitching line away from the strip boundary line for approximate 0 to 200 nm if the strip boundary line hitting the forbidden pattern. The method further includes stitching the modified polygon along the strip boundary line, and moving the stitching point away from the strip boundary line for approximate 0 to 200 nm if the stitching point landing on the modified forbidden pattern of the reference layer. The method also includes merging the stitched polygon to form the original modified polygon if the stitched polygon is smaller than 200 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of patterning a substrate, the method comprising:
   receiving an integrated circuit (IC) design layout data comprising pattern layers having a polygon and a forbidden pattern;
   modifying the polygon and the forbidden pattern using an electron proximity correction (EPC) technique;
   stripping the modified polygon into subfields, wherein the stripping the modified polygon includes:
      using the modified forbidden pattern as a reference layer, and
      stitching the modified polygon by avoiding stitching the modified forbidden pattern;
   converting the stripped polygon to an electron beam writer format data; and
   writing the electron beam writer formatted polygon onto a substrate by an electron beam writer.

2. The method of claim 1, wherein the modifying the polygon and the forbidden pattern by the EPC includes adding or subtracting a bias to or from the polygon and the forbidden pattern at a horizontal direction, a vertical direction, or both.

3. The method of claim 2, wherein the bias is from approximately 0 nm to 1000 nm.

4. The method of claim 1, wherein the stripping the modified polygon includes forming an OR layer from the modified polygon and the modified forbidden pattern.

5. The method of claim 4, further comprising stitching the modified polygon and avoiding stitching the forbidden pattern of the OR layer.

6. The method claim 1, wherein the stripping the modified polygon includes forming a NOT layer from the modified polygon and the modified forbidden pattern.

7. The method of claim 6, further comprising stitching the modified polygon by avoiding stitching the forbidden pattern of the NOT layer.

8. The method of claim 1, wherein the stripping the modified polygon includes setting a stitching line along a stripping boundary line by inspecting the forbidden pattern.

9. The method of claim 8, further comprising moving the stitching line away from the stripping boundary line if the stripping boundary line crosses the modified forbidden pattern.

10. The method of claim 1, wherein the stripping the modified polygon includes stitching the modified polygon along a strip pitch boundary line.

11. The method of claim 10, further comprising moving away from the strip pitch boundary line if a stitching point lands on the modified forbidden pattern.

12. The method of claim 1, wherein the avoiding stitching the forbidden pattern includes setting a stitching line away from the forbidden pattern approximately 0 nm to 200 nm.

13. The method of claim 1, further comprising merging the stitched polygon to the original modified polygon if the stitched polygon is smaller than approximately 200 nm.

14. A method of patterning a substrate, the method comprising:
   receiving an integrated circuit (IC) design layout data comprising pattern layers having a polygon and a forbidden pattern;
   modifying the polygon and the forbidden pattern using an electron proximity correction (EPC) technique;
   stripping the modified polygon into subfields, wherein the stripping the modified polygon includes:
      finding a forbidden pattern as a reference layer,
      forming an OR layer or a NOT layer with the reference layer, and
      stitching the modified polygon by avoiding stitching the forbidden pattern of the OR layer or the NOT layer;
   converting the stripped polygon to an electron beam writer format data; and
   writing the electron beam writer formatted polygon onto a substrate by an electron beam writer.

15. The method of claim 14, wherein the avoiding stitching the forbidden pattern of the reference layer includes moving a stitching line away from the forbidden pattern approximately 0 nm to 200 nm.

16. The method of claim 14, further comprising merging the stitched polygon to form the original modified polygon if the stitched polygon is smaller than approximately 200 nm.

17. A method of patterning a substrate, the method comprising:
   receiving an integrated circuit (IC) design layout data comprising pattern layers having a polygon and a forbidden pattern;
   modifying the polygon and the forbidden pattern using an electron proximity correction (EPC) technique;
   stripping the modified polygon into subfields, wherein the striping the modified polygon includes:
      finding the forbidden pattern as a reference layer, and
      stitching the modified polygon by avoiding stitching the forbidden pattern of the reference layer, wherein the avoiding stitching the forbidden pattern of the reference layer includes moving a stitching line away from a stripping boundary line;
   converting the stripped polygon to an electron beam writer format data; and
   writing the electron beam writer formatted polygon onto a substrate by an electron beam writer.

18. The method of claim 17, further comprising setting the stitching line by inspecting the forbidden pattern along the stripping boundary line, wherein the stitching line superimposes over the stripping boundary line if the stripping boundary line does not hit the forbidden pattern, or moving the stitching line away from the stripping boundary line approximately 0 nm to 200 nm if the stripping boundary line hits the forbidden pattern.

19. The method of claim 17, further comprising stitching the modified polygon along the stripping boundary line, and moving a stitching point away from the stripping boundary line approximately 0 nm to 200 nm if the stitching point lands on the modified forbidden pattern of the reference layer.

20. The method of claim 17, further comprising merging the stitched polygon to form the original modified polygon if the stitched polygon is smaller than approximately 200 nm.

* * * * *